United States Patent [19]

Hindman et al.

[11] Patent Number: 5,244,831
[45] Date of Patent: Sep. 14, 1993

[54] METHOD OF DOPING A POLYSILICON LAYER ON A SEMICONDUCTOR WAFER

[75] Inventors: Gregory Hindman, Boise; John Rule, Nampa; Jack Berg, Boise, all of Id.

[73] Assignee: Zilog, Inc., Campbell, Calif.

[21] Appl. No.: 877,871

[22] Filed: May 4, 1992

[51] Int. Cl.$^5$ ................... H01L 21/225; H01L 21/385
[52] U.S. Cl. ................................... 437/164; 437/233; 437/934; 437/141; 148/DIG. 122; 148/DIG. 123
[58] Field of Search ................... 437/20, 30, 160–164, 437/43, 141, 233, 934, 954–955, 959, 968, 980–982; 252/951; 148/DIG. 122, DIG. 125, DIG. 35

[56] References Cited

U.S. PATENT DOCUMENTS

| | | | |
|---|---|---|---|
| 3,442,725 | 5/1969 | Fifiman et al. | 252/951 |
| 3,507,716 | 4/1970 | Nishida et al. | 437/164 |
| 4,288,256 | 9/1981 | Ning et al. | 437/193 |
| 4,455,325 | 6/1984 | Razouk | 437/164 |
| 4,826,779 | 5/1989 | Wright et al. | 437/20 |
| 4,830,974 | 5/1989 | Cheng et al. | 437/43 |
| 4,851,361 | 7/1989 | Schumann et al. | 437/30 |

OTHER PUBLICATIONS

Schumacher, J. C., "Dopant Diffusion Guideline For The Process Engineer", Product Application Note No. 11, pp 1–7.

Primary Examiner—Olik Chaudhuri
Assistant Examiner—H. Jey Tsai
Attorney, Agent, or Firm—Majestic, Parsons, Siebert & Hsue

[57] ABSTRACT

The present invention concerns a method for doping a polysilicon layer with phosphorous in which phosphorous oxychloride is supplied to the silicon wafer near the beginning of the oven temperature ramping of the silicon wafer. By introducing the phosphorous oxychloride earlier than in prior art methods, the present invention can reduce the poly rho and poly rho sigma of the doped polysilicon layer. Alternatively, the root DT of the diffusion of the doped material in the doped silicon region on the silicon wafer can be reduced, which helps to maintain the junction depth of the doped silicon region.

8 Claims, 2 Drawing Sheets

METHOD OF DOPING A POLYSILICON LAYER ON A SEMICONDUCTOR WAFER

BACKGROUND OF THE INVENTION

This invention relates to a method of doping polysilicon layers on a silicon wafer. In the production of semiconductor chips, polysilicon layers are doped with phosphorous to form conductive layers.

One way to dope the polysilicon with phosphorous uses a two-step doping process. In the first step, called the predeposition phase, a phosphorous glass layer is formed on top of the polysilicon layer on a wafer. In the second step, called the drive-in-diffusion phase, phosphorous diffuses into the silicon from the phosphorous glass. The two-step doping process allows for lower temperatures during the doping than a pure gaseous doping, because more of the potential doped material is at the surface of the polysilicon layer.

FIG. 1 is a cross-sectional view of the semiconductor wafer with a silicon substrate 2, a doped silicon region 4, a gate oxide 6, and a field oxide 8. An undoped polysilicon layer 10 is formed on top of the wafer.

The wafer is then placed into an oven which is filled with nitrogen. The temperature of the oven is increased to the temperature required for the desired rate of the drive-in diffusion of phosphorous from the phosphorous glass layer. The temperature of the oven also determines the solid solubility of the phosphorous into the polysilicon. The oven is then stabilized at that temperature. Next, in the predeposition phase, oxygen gas and phosphorous oxychloride gas ($POCl_3$) are then introduced into the oven. The $POCl_3$ gas reacts with the oxygen in the oven to form a phosphorous glass on the polysilicon layer 10. The reaction of the oxygen gas and phosphorous oxychloride gas has the equation

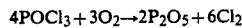

$$4POCl_3 + 3O_2 \rightarrow 2P_2O_5 + 6Cl_2$$

The phosphorous glass essentially has the formula $P_2O_5$ and the phosphorous glass forms a layer 12 shown in FIG. 2 on top of the semiconductor wafer.

The drive-in diffusion phase occurs when, in the heat of the oven, the phosphorous glass layer 12 on top of the polysilicon layer 10 reacts with the polysilicon following the equation

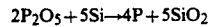

$$2P_2O_5 + 5Si \rightarrow 4P + 5SiO_2$$

In this reaction, the phosphorous diffuses into the polysilicon layer 10 from the phosphorous glass layer 12. This phosphorous makes the polysilicon layer more conductive. After a period of time, the temperature of the oven is cooled down and the semiconductor wafer is removed from the oven. Thereafter, in a deglazing step, the phosphorous glass is removed from on top of the polysilicon layer 10.

FIG. 3 shows a doped polysilicon layer 14 covering the silicon wafer. This doped polysilicon layer can then be shaped as desired to connect structures on the silicon wafer.

Although a conductive polysilicon layer can be formed with the prior art method, it is desired to improve the $POCl_3$ doping process.

SUMMARY OF THE INVENTION

In accordance with the principles of the present invention, the above and other objectives are realized by using a method of doping a polysilicon layer on a semiconductor wafer with phosphorous. This method includes heating an oven to a first temperature where the first temperature is less than the temperature at which oxygen significantly reacts with silicon; putting the wafer in an oven; thereafter slowly increasing the temperature of the oven, supplying $POCl_3$ to the wafer so that a phosphorous glass layer is formed on the polysilicon; thereafter leveling off the temperature of the oven at a second temperature, the second temperature being such that phosphorous diffuses into the polysilicon layer from the phosphorous glass at the desired rate; thereafter cooling the oven.

BRIEF DESCRIPTION OF THE DRAWINGS

The above and other features and aspects of the present invention will become more apparent upon the reading of the following detailed description in conjunction with the accompanying drawings, in which:

In FIGS. 1 through 3, the structures that are unchanged remain labelled with the same number between all three of the figures.

DETAILED DESCRIPTION OF THE PREFERRED EMBODIMENT

Figure 6:
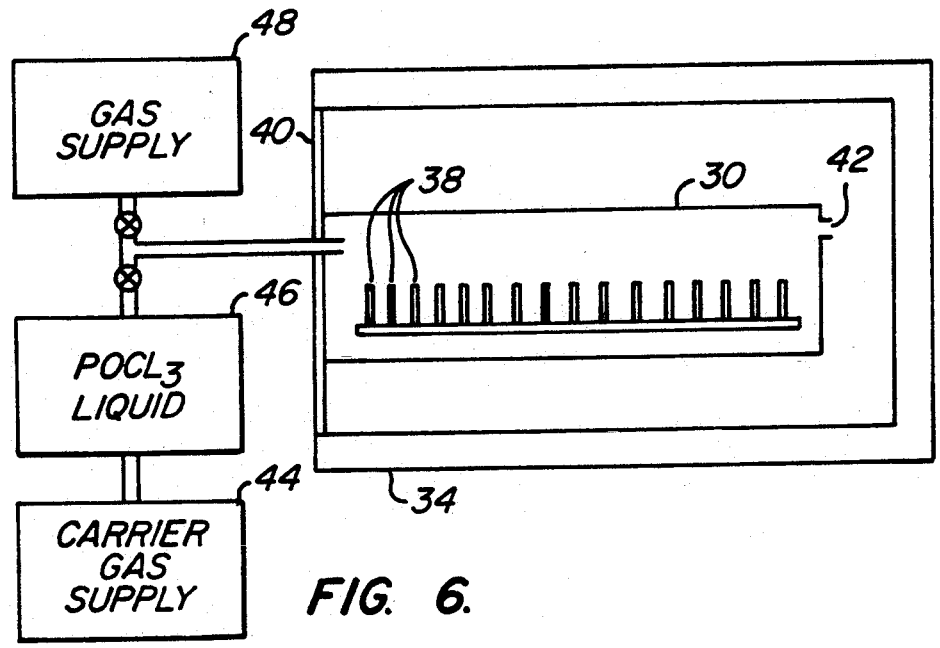
FIG. 6 is a diagram of the furnace or oven with a glass tube and attached gas supply used in the method of the present invention.

FIG. 6 is a diagram of the oven or heating tube with attached gas supply used in the method of the present invention. A glass tube 30 contains a cantilever 36 on which boats (not shown) containing wafers 38 are pushed into a furnace or oven 34 which supplies heat to the wafers 38. The furnace 34 is usually open, but placing the glass tube into the furnace 34 closes up the furnace. Gases can be introduced at an input 40 at one end of the glass tube 30 and vented out an output vent 42 on the other end. A nitrogen gas carrier from a carrier gas supply 44 can be bubbled through a pool of phosphorous oxychloride liquid in a bubbler 46 to evaporate some of the $POCl_3$ liquid and form $POCl_3$ gas in a nitrogen gas carrier. The amount of the $POCl_3$ suspended in the nitrogen depends on the temperature of the $POCl_3$. Other ways to supply the $POCl_3$ to the wafer are possible. Oxygen and nitrogen gas can be supplied to the heating tube or oven 30 by a gas supply 48. The rate of oxygen supply to the wafers preferably should be chosen so that most of the oxygen reacts with the $POCl_3$.

Figure 4:
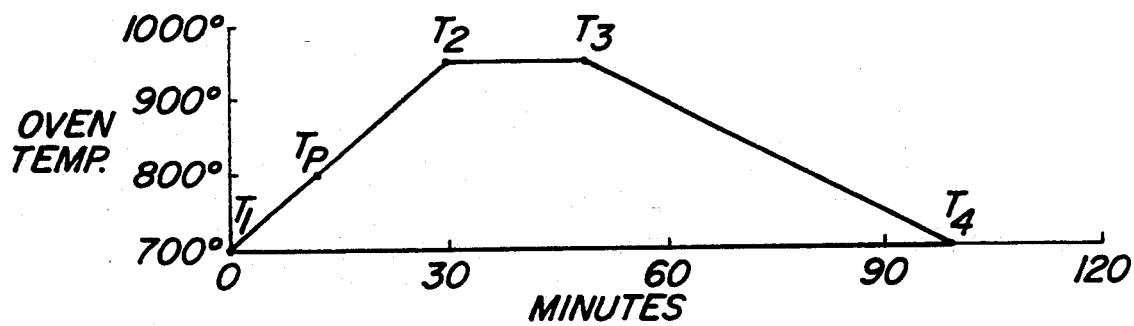
FIG. 4 is a graph of the oven temperature versus time for one of the embodiments of the present invention.

FIG. 4 is a graph of the oven temperature versus time for one of the present invention's embodiments. At time T1, the wafer with a polysilicon layer on top thereof is placed into the oven that has been heated to a first temperature. The first temperature of the furnace when the glass tube is slid into the furnace is a temperature less than the temperature in which the oxygen significantly reacts with the silicon in the polysilicon layer. When the glass tube 30 is first put into the furnace, the tube is full of air including oxygen gas. The preferred embodiment uses oven temperatures of about 700° C. as the first temperature. At oven temperatures of 700° C., some silicon dioxide is formed but not enough to inhibit the diffusion process.

Besides preventing the silicon dioxide from forming and slowing down diffusion, other reasons for putting the wafers into the furnace at a temperature below the temperature that the phosphorous diffuses into the polysilicon layer from a phosphorous glass layer include preventing thermal shock on the wafers, building up a phosphorous glass layer before reaching high temperatures and avoiding a temperature spike. The temperature spike would occur if the furnace open to the atmosphere were set for 950° C., for example, and the furnace was open to the atmosphere. Since the hot furnace would cause convection, the furnace open to the atmosphere would not reach 950° C., but the heating elements of the furnace would heat to their maximum temperature. When the furnace or oven becomes enclosed, the temperature of the oven would spike up beyond the desired 950° C. to 1000° C. or greater. It is possible to put wafers into the oven and then heat the oven to the first temperature, but this is not the preferred embodiment.

At time T1, the phosphorous oxychloride gas in the nitrogen carrier and oxygen gas are placed into the chamber as described above. In the preferred embodiment, during the phosphorous doping process, 95 mg per minute of $POCl_3$, 300 standard cubic centimeters per minute of oxygen gas and 7 liters per minute of the nitrogen carrier gas enters the oven. The phosphorous oxychloride gas in the nitrogen carrier and oxygen gas can be introduced to the wafer at the time or before the oven reaches a temperature sufficient to form a phosphorous layer.

From time T1 to time T2, the temperature of the oven is slowly ramped upwards to a second temperature. The temperature is slowly ramped so that the wafers will experience less thermal shock.

At time $T_p$ when the oven is around 800° C., the phosphorous glass layer begins to form on top of the polysilicon layer following the equation

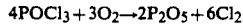

$$4POCl_3 + 3O_2 \rightarrow 2P_2O_5 + 6Cl_2$$

Figure 1:
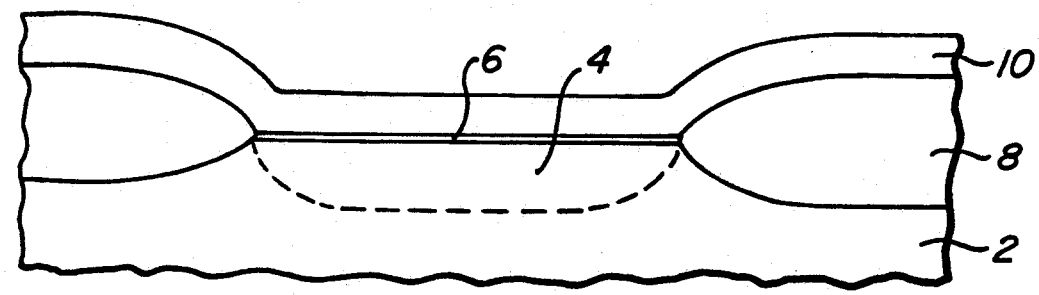
FIG. 1 is a cross-sectional view showing the prior art silicon wafer with the polysilicon layer before the doping with the phosphorous.
Figure 2:
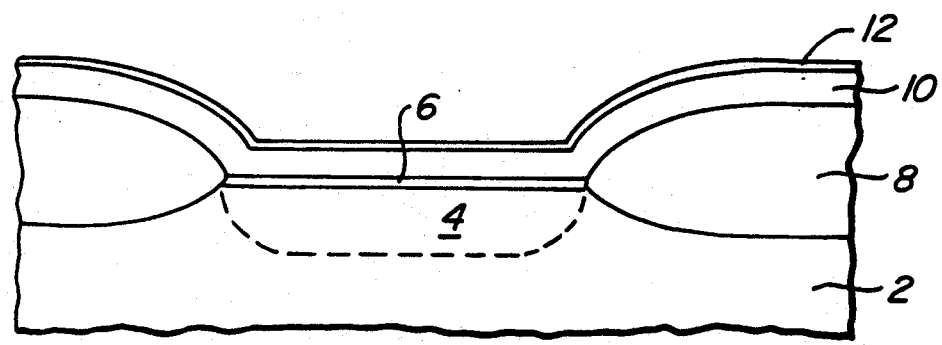
FIG. 2 is a cross-sectional view showing the prior art silicon wafer with a phosphorous glass layer on top of the polysilicon.
Figure 3:
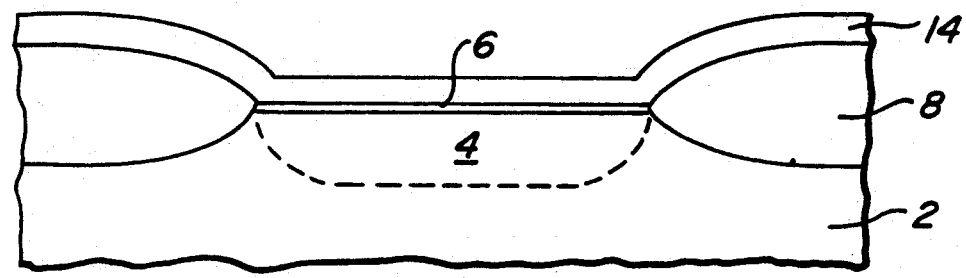
FIG. 3 is a cross-sectional view showing the prior art silicon wafer with a doped polysilicon layer.

This phosphorous glass layer 12 covers up the polysilicon layer 10 as shown in FIG. 2.

From time $T_p$ to $T_2$, the method of the present invention forms a layer of phosphorous unlike the prior art method. It has been found that an effective phosphorous glass layer for doping the polysilicon is formed even though some polysilicon may react with the oxygen to form silicon dioxide. When a thin film of this phosphorous glass layer is formed, the production of any silicon dioxide on top of the polysilicon layer 10 is reduced.

The diffusion rate of the phosphorous into the polysilicon layer increases depending upon the temperature of the oven. As the temperature increases, the diffusion reaction occurs quicker. Additionally, the solid solubility of the phosphorous into the polysilicon depends on the temperature of the oven. In the prior art, a temperature is chosen for the desired rate of drive-in diffusion to occur, and the predeposition phase begins when the oven reaches that temperature. The diffusion reaction is speeded up in the present invention by the fact that a phosphorous glass layer is already in place by the time the temperature reaches the second temperature at time T2. The second temperature of the oven is such that phosphorous diffuses into the polysilicon layer from the phosphorous glass layer at the desired rate. In the preferred embodiment, this second temperature is about 950° C.

In the embodiment shown in FIG. 4, the temperature remains at the second temperature of 950° C. for around eighteen minutes until time T3. At time T3, the $POCl_3$ gas and oxygen gas are no longer supplied to the chip, and nitrogen gas alone is sent through the glass tube. The wafer is allowed to slowly cool by reducing the oven temperature to below 800° C. in a slow fifty minute long temperature ramp.

One possible problem with the prior art method of depositing phosphorous in the polysilicon layer is related to the fact that the doped material in the silicon doped regions diffuses away from the doped region as a function of the temperature and the time. The junction depth of the doped silicon region is proportionate to the root DT. The root DT is the square root of the sum of a diffusion coefficient multiplied by the time. The diffusion coefficient is an exponentially dependent on the temperature. At temperatures of 700° C. or lower, the root DT for a given amount of time is small. However, at temperatures where the desired rate of the drive-in diffusion occurs, for example at around 950° C., the root DT for a given amount of time is significant. If the wafer is heated for too long at temperatures around 950° C., the junction depth will increase. At the smaller die sizes now being used in semiconductor production, it is desired to maintain a shallow junction depth. Therefore, It would be beneficial to reduce the amount of time that the silicon wafer remains at high temperatures. Because the phosphorous oxychloride gas and the oxygen gas are introduced earlier at time T1, the phosphorous diffusion from the phosphorous glass occurs in less time, so that the time that the oven stays at 950° C. is reduced.

Figure 5:
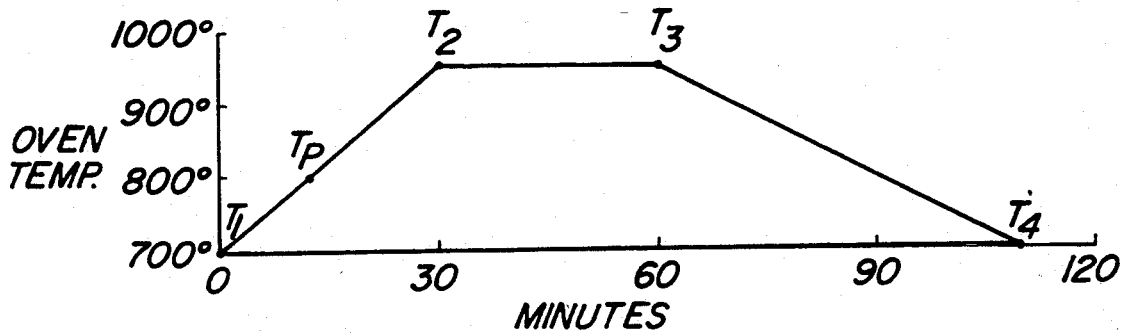
FIG. 5 is a graph of the oven temperature versus time for another embodiment of the present invention.

An alternate embodiment of the present invention is shown in FIG. 5. FIG. 5 shows a graph of the temperature of the oven versus the time in the oven of an alternative embodiment of the present invention. At time T1, the phosphorous oxychloride gas and oxygen gas are introduced in the same concentrations discussed above. Between time T1 and time T2, the temperature of the oven is raised from 700° C. to 950° C. in a slow ramp. The temperature of the oven then remains at 950° C. for thirty minutes until time T3. At time T3, the $POCl_3$ gas and the oxygen gas are no longer sent to the oven and the temperature of the oven is ramped down below 800° C. in about fifty minutes.

By supplying the $POCl_3$ gas near the beginning of the oven temperature ramp, there is more time for the phosphorous to diffuse from the phosphorous glass layer into the polysilicon layer and thus the polysilicon can be made more conductive than if the $POCl_3$ and oxygen are introduced only when the temperature reaches 950° C. Up to a certain point, the polysilicon conductivity depends upon the amount of doped phosphorous in the polysilicon layer. This diffusion of phosphorous into the polysilicon depends upon the amount of time that the phosphorous glass remains on the polysilicon layer at the temperatures in which the diffusion occurs.

A control method using the oven temperature versus time graph of FIG. 5, but introducing the $POCl_3$ and oxygen only when the oven temperature reaches 950° C. at time T2, was tested against the present invention described above for FIG. 5 which introduces the POCl₃ gas and oxygen at the beginning of the temperature ramp, time T1. The control method had a polysilicon conductivity or poly rho of 19.97 ohms per square, with a poly rho sigma of 1.7, while the present invention had a poly rho of 17.68 rows per square with a poly rho sigma of 0.20. The reduction of the poly rho sigma is important because it reduces the variability among the different chips of the conductivity of the polysilicon layer. The conductivity is measured in ohms per square.

The embodiment of the present invention using the time versus oven temperature graph of FIG. 5 causes the same root DT diffusion of the doped silicon region on the silicon wafer as the control method, but the method of present invention shown using oven temperature versus time graph of FIG. 5 has a higher conductivity and a tighter sigma of the polysilicon rho. One figure used as a specification is the process capability of the process, which is equal to the specification's range over six times the standard deviation. The process capability is much better for the method of the present invention shown in FIG. 5 than for the control method.

The method of the present invention using the oven temperature versus time graph of FIG. 4 has a polysilicon layer conductivity similar to the control method described above, but the root DT diffusion of the doped material in the doped silicon region is lower for the method shown in FIG. 4 than for the control method. Additionally, the time required for the process is lower in the embodiment of the present invention shown in FIG. 4 than in the control method.

Various details of the implementation and method are merely illustrative of the invention. It will be understood that various changes of details may be within the scope of the invention, which is to be limited only by the appended claims.

What is claimed is:

1. A method of doping a polysilicon layer on a semiconductor wafer with phosphorus comprising the steps of:
    heating an oven to a first temperature wherein said first temperature is less than 800° C. so that the first temperature is less than the temperature sufficient to form a phosphorous layer on the polysilicon;
    putting the wafer in the oven;
    thereafter, slowly increasing the temperature of the oven;
    supplying phosphorous oxychloride to the wafer so that a Phosphorus glass layer is formed on the polysilicon;
    thereafter, leveling off the temperature of the oven at a second temperature, said second temperature being such that phosphorous diffuses into the polysilicon layer from the phosphorous glass layer; and
    thereafter, cooling the oven.

2. The method of claim 1, wherein the first temperature is about 700° C.

3. The method of claim 1, wherein the second temperature is about 950° C.

4. The method of claim 1, wherein the POCl₃ supplying step occurs at the beginning of the oven temperature increasing step.

5. The method of claim 1, wherein the POCl₃ supplying step occurs at or before the time that the oven reaches a temperature sufficient to form a phosphorous layer on the polysilicon.

6. The method of claim 1, wherein the oven cooling step occurs about seventeen minutes after the oven temperature leveling step.

7. The method of claim 1, wherein the oven cooling step occurs about thirty minutes after the oven temperature leveling step.

8. The method of claim 1, wherein the oven temperature leveling off step occurs about thirty minutes after the oven temperature increasing step.

* * * * *